United States Patent [19]
Winslow

[11] Patent Number: 6,118,343
[45] Date of Patent: Sep. 12, 2000

[54] POWER AMPLIFIER INCORPORATING SINGLE DRAIN SWITCH AND SINGLE NEGATIVE VOLTAGE GENERATOR

[75] Inventor: Thomas Aaron Winslow, Salem, Va.

[73] Assignee: Tyco Electronics Logistics AG, Steinach, Switzerland

[21] Appl. No.: 09/309,228

[22] Filed: May 10, 1999

[51] Int. Cl.[7] .................................................. H03F 3/68
[52] U.S. Cl. .............................................. 330/295; 330/51
[58] Field of Search .................................. 330/51, 124 R, 330/124 D, 126, 295

[56] References Cited

U.S. PATENT DOCUMENTS

| | | | |
|---|---|---|---|
| 5,060,294 | 10/1991 | Schwent et al. | 330/296 |
| 5,126,688 | 6/1992 | Nakanishi et al. | 330/285 |
| 5,438,684 | 8/1995 | Schwent et al. | 330/124 R |
| 5,621,353 | 4/1997 | Botti et al. | 330/51 |
| 5,694,085 | 12/1997 | Walker | 330/295 |
| 5,712,592 | 1/1998 | Stimson et al. | 330/295 |
| 5,774,017 | 6/1998 | Adar | 330/51 |
| 5,793,253 | 8/1998 | Kumar et al. | 330/124 R |
| 5,872,481 | 2/1999 | Sevic et al. | 330/295 |
| 5,994,955 | 11/1999 | Birkeland | 330/51 |

*Primary Examiner*—Robert Pascal
*Assistant Examiner*—Khanh Van Nguyen
*Attorney, Agent, or Firm*—Arthur L. Plevy; Buchanan Ingersoll PC

[57] ABSTRACT

A dual band power amplifier circuit comprising first and second power amplifiers each operative to amplify an RF signal of a particular frequency range at an output terminal thereof, wherein the output terminals of the amplifiers are coupled at a common node, and wherein the amplifiers are operative in a first saturation mode and a second linear mode; a control circuit for providing a first control signal to the first power amplifier and a second control signal to the second power amplifier for controlling the mode of operation of each amplifier; and a switching device having a first terminal coupled to the outputs of the first and second power amplifiers at the common node and to a power source at a second terminal, the switching device responsive to a third control signal from the control circuit for providing a high output impedance to the amplifiers for limiting leakage current when the first and second amplifiers are in the saturation mode, and for enabling current to be drawn from the power source to a particular one of the power amplifiers when the particular power amplifier is in the linear mode.

20 Claims, 2 Drawing Sheets

POWER AMPLIFIER INCORPORATING SINGLE DRAIN SWITCH AND SINGLE NEGATIVE VOLTAGE GENERATOR

FIELD OF THE INVENTION

The invention relates in general to power amplifiers, and more particularly to dual-band semiconductor amplifiers useful in wireless applications.

BACKGROUND OF THE INVENTION

There are currently many different wireless communications systems promulgated by the telecommunications industries and used in the world. These systems are complex and they set forth specifications regarding all aspects of wireless communications, including physical characteristics of signal transmission, such as transmission frequency and operation mode.

One of the earliest wireless communication systems developed in North America is called the advanced mobile phone service ("AMPS"). Used for analog cellular communications, AMS specifies a mobile station transmission frequency band between 824 MHz and 849 MHZ. This band is often referred to as the 800 MHZ band or the cellular band. Within the same frequency band also operates a later developed system called the digital mobile phone service ("DMPS"), which is used for both digital and analog communications. These systems are generally referred to in the industry as AMPS 800 and DMPS 800.

A European wireless communication system, now being used in North America and other parts of the world, the global system for mobile communications ("GSM"), specifies a mobile station transmission frequency band between 890 MHZ to 915 MHZ and it is used for digital communications. Still another system, called personal communications system ("PCS") 1900 specifies a mobile station transmission frequency between 1850 MHZ and 1910 MHZ. The transmission frequency of PCS 1900 is substantially higher than that of AMPS 800 or GSM 800.

There exist many other cellular communications systems. For example, the nordic mobile telephone 450 system ("NMT-450) specifies a transmission frequency between 463 MHZ and 469 MHZ and the signal modulation technique of FDMA. The nordic mobile telephone 900 system ("NMY-900) specifies a transmission frequency between 935 MHZ and 960 MHZ and the same signal modulation technique.

As for digital cordless telephones, there are, for example, cordless telephone 2 ("CT2") requiring a transmission frequency between 864 MHZ and 868 MHZ and modulation technique of TDMA/FDM, and digital European cordless telephone ("DECT") specifying a transmission frequency between 1880 MHZ and 1900 MHZ with the same modulation technique.

Those different transmission frequency bands and operating modes present a unique challenge for wireless service providers and particularly for manufactures of wireless communications equipment. If a service provider wishes to replace its currently used wireless system with one operating in a higher frequency band (e.g. from AMPS 800 to PCS 1900), the existing base stations must be upgraded so that they operate in accordance with the new system. By using upconverters which convert a lower frequency signal to a higher frequency signal, the base stations can be upgraded to operate at a higher frequency signal, the base stations can be upgraded to operate at a higher frequency. Of course, the base stations must also be updated to comply with other aspects of the new wireless system.

In addition to upgrading the base stations, individual cellular telephones in the hands of customers must also be upgraded or replaced so that they be compatible with the new wireless system. In particular, since the power amplifier used in each cellular phone is optimized to operate within a particular frequency band and at a particular mode, it needs to be replaced with a new power amplifier suitable for operation under the new wireless standard.

For example, cellular phones used for AMPS 800 contain a power amplifier optimized to operate within the cellular band (i.e. the 800 MHZ band). If, however, AMPS 800 is replaced with PCS 1900, the old AMPS phones cannot be used any more, they must be upgraded or replaced. Replacement of cellular phones is expensive. A new cellular phone which can be easily upgraded is desired.

For cellular phone manufactures, different wireless systems require different power amplifiers, which increases cost. Different wireless systems present another problem. If a cellular phone user crosses from one area served by one wireless system into an area served by a different wireless system, he will not be able to use his phone. It is desired that the same cellular phone be used under different wireless systems and that the user can simply activate a switch to use it under a different wireless system. Preferably, when a user enters into an area served by different wireless system, the user's phone is automatically switched to operate under the new wireless system that covers the area. This can be achieved by a base station sensing a signal to the cellular phone to switch the cellular phone. In any event, it requires a power amplifier system capable of operating under different wireless systems.

MESFET power amplifiers for wireless applications generally require both a control circuit and a drain switch for controlling both the output power of the amplifier in an ON state, as well as to limit excessive leakage when in an OFF state. The proliferation of dual-band cell phones have required the use of dual-band power amplifiers. Single band MESFET power amplifiers often require a single drain switch. The control circuit of such an amplifier typically takes the form of a commercially available silicon MOSFET having a low Rds (drain to source resistance), and a silicon or gallium arsenide based negative voltage generator (nvg) and a control circuit.

Gallium arsenide-based control circuits typically take the form of a differential amplifying front end having a current biased level shifting buffer for translating input control signals (typically 0–3 volts) from a D/A converter to the negative MESFET voltage levels. Dual-band amplifiers (versus single band amplifiers) typically use two drain switches in control circuits; one for each power amplifier (PA) under control. The increased cost of a dual-band power amplifier which utilizes two drain switches and two negative voltage generators is a significant factor which prevents widespread use of such a device in a low cost dual-band application. Furthermore, the use of separate control circuits and drain switches provide an additional increase in the overall cost of the device by increasing the number of part insertions (for a phone manufacturer, for example), as well as increasing the overall phone board space for implementation.

In accordance with the present invention, there is provided a dual-band amplifier controller that utilizes only one drain switch and a single negative voltage generator. Because a dual-band telephone operates in only one band at any given time, only one power amplifier will be in operation (i.e. active) at any given time interval. That is, only one power amplifier will be drawing current from the battery at a time. This feature allows both power amplifiers to share a single drain switch, provided there is sufficient capacitive by-passing. Such a dual-band solution greatly simplifies the design, cost and complexity of a dual-band power amplifier.

SUMMARY OF THE INVENTION

It is an object of the present invention to provide a multiband power amplifier system operative in a first receive mode and in a second transmit mode for amplifying a radio frequency (RF) signal having one of a plurality of preselected frequencies comprising a first power amplifier having a signal input for receiving an RF signal of a first preselected frequency and an output terminal for outputting the amplified RF signal, and a second power amplifier having a signal input for receiving an RF signal of a second preselected frequency and an output terminal for outputting the amplified RF signal; means for coupling the outputs of said first and second power amplifiers at a common terminal; controller means coupled to the first and second power amplifiers and responsive to the first and second modes for causing the first and second power amplifiers to operate in saturation when the system is in the receive mode, and for causing one of the first and second power amplifiers to operate in a linear mode according to the frequency of the RF signal when the system is in the transmit mode; and switching means coupled to the output of the first and second power amplifiers at said common terminal and responsive to the controller means for providing a high output impedance to the power amplifiers when the system is in receive mode, and enabling the power amplifier operating in the linear mode to draw current from a power source when the system is in transmit mode.

It is another object of the present invention to provide a multiband power amplifier system for amplifying a radio frequency (RF) signal having one of a plurality of preselected frequencies comprising a first power amplifier having a signal input for receiving an RF signal of a first preselected frequency and amplifying the RF signal to produce an amplified RF signal at an output terminal, and a control input for receiving a control signal; a second power amplifier having a signal input for receiving an RF signal of a second preselected frequency to produce an amplified RF signal at an output terminal, and a control input for receiving a control signal; means for coupling the output terminals of the first and second power amplifiers at a common node; controller means coupled to the first and second power amplifiers for providing a first control signal to the first power amplifier control input and a second control signal to the second power amplifier control input for activating in a first mode, and for deactivating in a second mode, the respective power amplifiers; and a switching device having a first terminal coupled to the output of each of the first and second power amplifiers at the common node and capacitively coupled to a reference potential at the first terminal, and a second terminal coupled to a power source, the switching device responsive to a control signal from the controller means for providing a high impedance at the output of the first and second power amplifiers when the power amplifiers are deactivated, and for enabling current to be drawn from the power source to an active power amplifier to enable amplification of the RF signal of preselected frequency.

It is still further an object of the present invention to provide a dual band power amplifier circuit comprising first and second power amplifiers each operative to amplify an RF signal of a particular frequency range at an output terminal thereof, wherein the output terminals of the amplifiers are coupled at a common node, and wherein the amplifiers are operative in a first saturation mode and a second linear mode; a control circuit for providing a first control signal to said first power amplifier and a second control signal to the second power amplifier for controlling the mode of operation of each amplifier; and a switching device having a first terminal coupled to the outputs of the first and second power amplifiers at the common node and to a power source at a second terminal, the switching device responsive to a third control signal from the control circuit for providing a high output impedance to the amplifiers for limiting leakage current when the first and second amplifiers are in the saturation mode, and for enabling current to be drawn from the power source to a particular one of the power amplifiers when the particular power amplifier is in the linear mode.

DETAILED DESCRIPTION OF THE INVENTION

The present invention provides a multiband amplifier with high power and efficiency for wireless or other applications where a multiband amplifier is required. When an amplifier is placed in operation at a substantially different frequency than it is originally designed for, the input and output impedance of the amplifier and any interstage impedance changes due to the change in frequency. As a result, the amplifier no longer provides matching input impedance. Moreover, the output impedance of the amplifier also changes. Still further, if there had been matching interstage impedance at the original frequency, it likely no longer exists at the new frequency, and the amplifier generally can no longer provide the required AC gain output power level and efficiency. For example, a conventional 800 MHZ power amplifier would not properly operate at 1900 MHZ. The present invention demonstrates a solution for dual-band amplifer control that utilizes only one drain switch and a single negative voltage generator. In the present invention, two power amplifiers operate to share a single drain switch, since only one power amplifier will operate at any given time. A capacitor is coupled to the drain switch and to the amplifier outputs at a first terminal and to ground at a second terminal to provide sufficient capacitive bypassing to permit each amplifier to operate as though the other amplifier were not in circuit. Such a dual-band solution greatly simplifies the design, cost and complexity of dual-band power amplifier circuitry.

Figure 1:
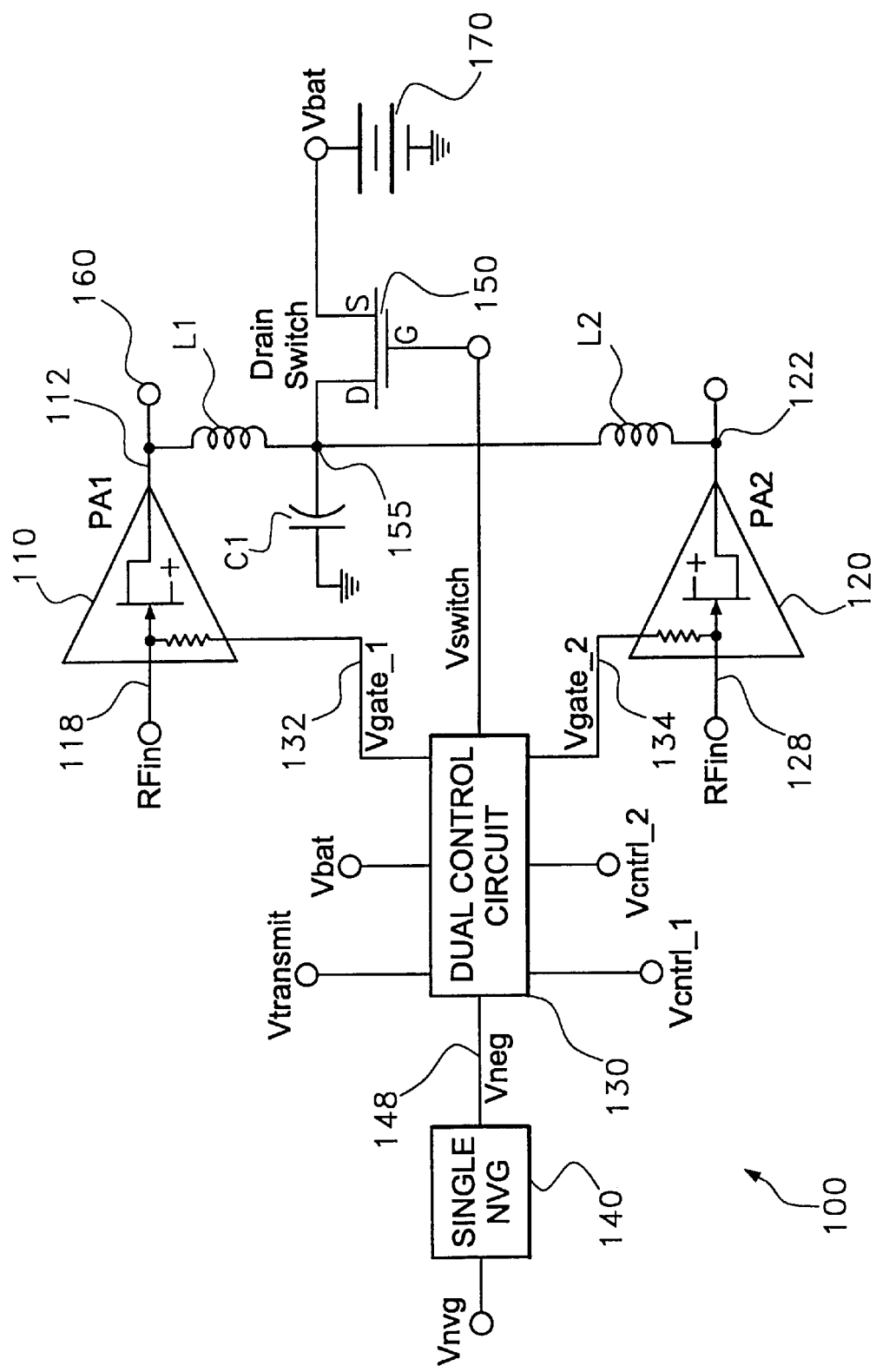
FIG. 1 shows a circuit schematic illustrating the power amplification system according to the present invention.

Referring now to FIG. 1, there is shown a dual-band power amplifier system 100 for a cellular phone which is operative at different RF frequencies and at different modes. The amplifier system 100 comprises a first power amplifier 110 (PA1) and a second power amplifier (PA2) 120, a dual control circuit module 130 and a single negative voltage generator module 140. A single drain switch 150 formed of a FET device such as MOSFET has a drain electrode D connected to common node 155 which is also coupled to each of the output terminals 112 and 122 of each of the respective first and second power amplifiers PA1 and PA2 via corresponding inductors L1 and L2. That is, inductor L1 has a first terminal directly connected to the power amplifier PA1, output terminal 112, and a second terminal directly connected to common node 155. Inductor L2 has a first terminal connected directly to the output node 122 of power amplifier PA2, and a second terminal connected directly to common node 155.

A single negative voltage generator 140 operates by receiving a voltage Vnvg at an input terminal and applying a negative voltage 142 (Vneg) to an input of dual control circuit 130. The single negative voltage generator provides a sufficient negative voltage utilized by both power amplifiers 110 and 120 in the dual band design. A negative voltage from NVG 140 is then applied to dual control circuit 130 comprising two independent level shifting control circuits. These conventional level shifting control circuits operate to translate the input voltage to a corresponding negative voltage sufficiently negative to control and to completely pinch off each of the power amplifiers 110 and 120 (i.e. deactivate) when power amplification operation is not required. The dual control circuit 130 is coupled to the input of each of the respective power amplifier via a corresponding control line (132, 134) which carries a control signal to the respective inputs 118 and 128 of the power amplifiers.

A single drain switch 150 having a source, gate and drain is coupled between a power source 170 such as a battery voltage at source terminal S and capacitively coupled to ground potential at a drain terminal D. When the cellular phone, and hence amplifying system 100 is in receive mode, the drain switch is off, which reduces the power amplifier leakage current to approximately 1 microamp ($\mu A$). When the phone and system 100 is in a transmit mode indicative of a call being made, the transmitting power amplifier which depends on the local cell base frequency, is turned (e.g. PA1) on and the idle power amplifier (e.g. PA2) is pinched off by using the gate control voltages ($V_{gate1}$ and $V_{gate2}$). Each power amplifier is individually RF choked and capacitively by-passed. The drain bias lines are then joined at the common drain switch 150 as shown in FIG. 1. Note that any dual-band cell phone utilizing FET devices may use such a technique to reduce the overall phone size and solution cost.

In the preferred embodiment, each of the power amplifiers are formed of MESFET devices and are operative in either a saturation mode (i.e. pinch off or deactivated mode) or in a linear mode (i.e. activated mode). Drain switch FET 150 is connected to control circuit 130 at its gate terminal via control line 136. Capacitor C1 has a first terminal coupled to common node 155 and a second terminal coupled to ground potential to provide capacitive bypassing within the circuit.

The first amplifier PA1 is suitable to operate around a first frequency F1 (for example, 800 MHZ) or in a first frequency band (for example, the cellular band). The second amplifier 120 is suitable to operate around a second frequency F2 (for example, 1900 MHZ) or in a second frequency band (for example, the PCS band). Depending on the frequency of the input signal ($Rf_{in}$) and based on the mode of operation of the amplifier system 100, the configuration illustrated in FIG. 1 provides a control circuitry and drain switch which both controls the output power of the amplifier (110 or 120) in the "on" or activated state, while limiting excessive leakage in the "off" or deactivated state.

Figure 2:
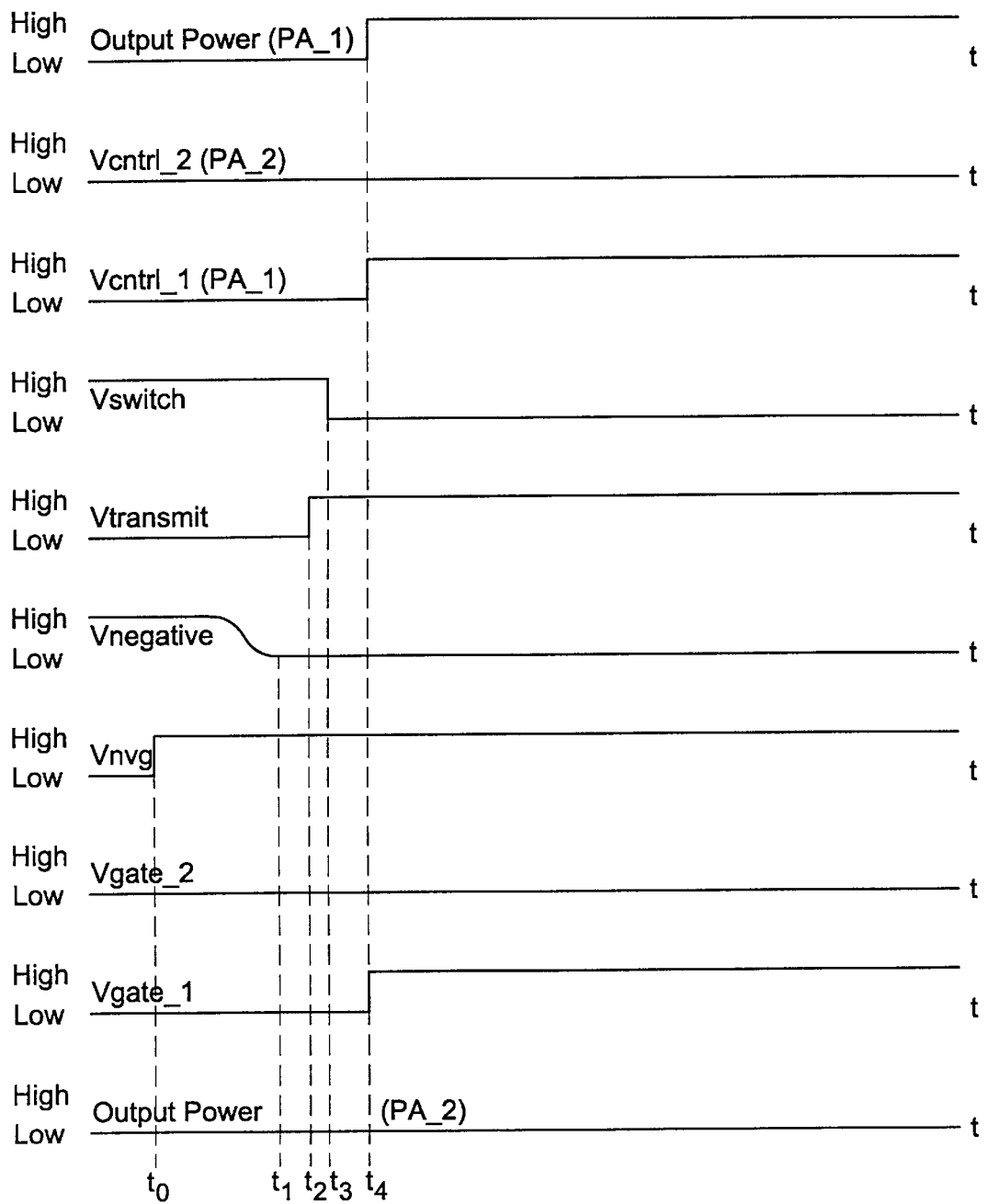
FIG. 2 shows a schematic illustration of signal levels associated with the initiation of transmission of one of the dual band power amplifiers according to the present invention.

Referring now to FIG. 1 in conjunction with FIG. 2, the following describes the operation of the dual band power amplifier circuit 100. Application of voltage $V_{nvg}$ to the input of negative voltage generator 140 results in a negative voltage $V_{neg}$ 142 into dual control circuitry 130. When the system 100 is in the receive mode, control signals $V_{gate\ 1}$ and $V_{gate\ 2}$ are at a low logic level and are applied to the input of each of the power amplifiers 110 and 120. This causes the amplifiers to be completely pinched off and hence, deactivated. A control signal $V_{switch}$ is also output from control circuit 130 to the gate electrode of drain switch 150. In the preferred embodiment, when the amplifier system is in receive mode, this input represents a logic high value at the gate so that the drain switch is off (i.e. non-conducting). In this situation, such as in the case wherein a cellular telephone is in a receive mode of operation awaiting a telephone call, the multiband power amplifier system 100 manifests the receive mode of operation by having each of the power amplifiers deactivated (via control signals $V_{gate1}$ and $V_{gate2}$) and the drain switch turned off (via control signal $V_{switch}$). Since the drain switch is off or non-conducting, the power amplifier leakage current is substantially reduced. When the cell phone transitions to a transmit mode indicative of a call being made, a particular RF frequency signal range for transmission is used to amplify signal Rfin. A signal $V_{transmit}$, is input to the control circuit 130 indicating a transition from the receive mode to the transmission mode and, depending on the local cell base frequency, one of the two power amplifiers 110 or 120 is activated for transmitting the RF input signal according to the frequency of the signal. This is accomplished by each of the input control signals, $V_{cntrl1}$ which is used to adjust the control signal $V_{gate1}$ associated with power amplifier 110; and $V_{cntrl2}$, which is used to adjust the gate signal $V_{gate2}$ to control the mode of power amplifier 120.

As indicated in FIG. 2, the control circuit 130 is responsive to the control signal $V_{transmit}$ indicating transmission mode of operation (at time $t_2$). For operation in first frequency band f1, control circuit 130 is also responsive to a change in the level of signal $V_{cntrl1}$ indicating a request to activate power amplifier 110. This results in a corresponding change in the signal $V_{gate1}$ from a logic low to a logic high level (at time t4). Control signal $V_{gate2}$ remains at a logic low level since PA2 is to remain off or "de-activated". In addition, the drain switch 150 is switched from "off" mode to "on" mode via control signal $V_{switch}$ which changes from a logic high to a logic low value (at time $t_3$). $V_{switch}$ is applied to the gate of MOSFET 150. In this manner, power amplifier 120 remains pinched off or in saturation mode, while power amplifier 110 is activated to amplify the RF input signal. The output power at node 160 thus changes from a logic low to a logic high level as indicated in FIG. 2 (time $t_4$).

As can be seen, the drain switch 150 thus operates as a high output impedance to any power amplifier which is in a receive mode of operation, while enabling the power amplifier which operates in an active mode or linear mode of operation to draw current from battery 170. Further, as evidenced by the diagram of FIG. 1, each power amplifier is individually RF-choked via inductors L1 and L2 and capacitively bypassed via capacitor C1. Drain bias lines are joined at the common drain switch 150 via common node 155. In the event that a switchover is needed from the first frequency F1 associated with power amplifier 110 to second frequency F2 associated with power amplifier 120 (such as when a mobile telephone changes cells operating in different frequency bands), a change in the levels of control signals $V_{cntrol2}$ and $V_{cntrol1}$ input to dual control circuit 130 occurs. This results in a corresponding change in logic levels in output control signals $V_{gate2}$ and $V_{gate1}$ such that power amplifier 110 would be pinched off (i.e. operated from saturation mode), while power amplifier 120 would be activated so as to receive an amplify signal $Rf_{in}$ associated with a second frequency band.

In the preferred embodiment, a single negative voltage generator translates the input voltage of approximately 0–3 volts to a corresponding negative voltage of −3 to 0 volts. Further, for most three volt telephones, a battery voltage of 2.7 to 5.5 volts is utilized. Typical inductance values for inductors L1 and L2 are band dependent, but range between 20–30 nH, while the typical value for bypass capacitor C1 for providing an RF short is approximately 60 pf.

While there has been shown a preferred embodiment, numerous embodiments may exist without departing from the spirit and scope of this invention. For example, while a drain switch comprising a MOSFET device has been shown, other devices may be utilized, such as a bi-polar junction transistors or mechanical switches. Further, while the power amplifiers generally comprise p-channel GaAs MESFET devices, other transistive devices may also be utilized. Any and all such differences are to be included within the scope of the invention as defined by the appended claims.

What is claimed is:

1. A multiband power amplifier system operative in a first receive mode and in a second transmit mode for amplifying a radio frequency (RF) signal having one of a plurality of preselected frequencies comprising:

a first power amplifier having a signal input for receiving an RF signal of a first preselected frequency and an output terminal for outputting the amplified RF signal, and a second power amplifier having a signal input for receiving an RF signal of a second preselected frequency and an output terminal for outputting the amplified RF signal;

means for coupling the outputs of said first and second power amplifiers at a common terminal;

controller means for causing said first and second power amplifiers to operate in saturation when said system is in said receive mode, and for causing one of said first and second power amplifiers to operate in a linear mode according to the frequency of said RF signal when said system is in said transmit mode; and switching means coupled to the output of said first and second power amplifiers at said common terminal and responsive to said controller means for providing a high output impedance to said power amplifiers when said system is in receive mode, and enabling said power amplifier operating in said linear mode to draw current from a power source when said system is in transmit mode.

2. The system according to claim 1, wherein said controller means comprises a single negative voltage generator.

3. The system according to claim 2, wherein said controller means further comprises a shifting level control circuit coupled to the output of said negative voltage generator for translating an input voltage to a corresponding negative voltage at the input of said power amplifiers sufficiently negative to saturate said power amplifiers when said system is in said receive mode.

4. The system according to claim 1, wherein said controller means is responsive to a transmit control signal for activating one of said first or second power amplifiers via a corresponding first or second control signal to cause said corresponding power amplifier to operate in said linear mode.

5. The system according to claim 1, wherein said controller means is responsive to a transmit control signal for generating a third control signal for activating said switching device for enabling power to be drawn to one of said first or second power amplifiers.

6. The system according to claim 1, wherein said first and second power amplifiers comprise MESFETs.

7. The system according to claim 1, wherein said switching means comprises a single field effect transistor (FET).

8. The system according to claim 1, wherein said first FET terminal comprises a drain electrode and wherein said second FET terminal comprises a source electrode.

9. The system according to claim 8, wherein said FET is responsive to a third control signal from said controller means applied to a gate electrode for switching between an "off" state wherein said FET operates to block current to said first and second amplifiers, to an "on" state where current is drawn to one of said first or second power amplifiers.

10. The system according to claim 7, wherein said FET is capacitively coupled at said first terminal to a reference potential for providing capacitive bypassing to said power amplifiers.

11. A multiband power amplifier system for amplifying a radio frequency (RF) signal having one of a plurality of preselected frequencies comprising:

a first power amplifier having a signal input for receiving an RF signal of a first preselected frequency and amplifying said RF signal to produce an amplified RF signal at an output terminal, and a control input for receiving a control signal; a second power amplifier having a signal input for receiving an RF signal of a second preselected frequency to produce an amplified RF signal at an output terminal, and a control input for receiving a control signal;

means for coupling said output terminals of said first and second power amplifiers at a common node;

controller means for providing a first control signal to said first power amplifier control input and a second control signal to said second power amplifier control input for activating in a first mode, and for deactivating in a second mode, said respective power amplifiers; and a switching device having a first terminal coupled to the output of each of said first and second power amplifiers at said common node and capacitively coupled to a reference potential at said first terminal, and a second terminal coupled to a power source, said switching device responsive to a control signal from said controller means for providing a high impedance at the output of said first and second power amplifiers when said power amplifiers are deactivated, and for enabling current to be drawn from said power source to an active power amplifier to enable amplification of said RF signal of preselected frequency.

12. The system according to claim 1, wherein said controller means comprises a control circuit coupled to the output of a single negative voltage generator for translating an input voltage to a corresponding negative voltage sufficiently negative to saturate said power amplifiers, thereby causing said amplifiers to enter the deactivated state.

13. The system according to claim 1, wherein said controller means is responsive to a transmit control signal for activating one of said first or second power amplifiers via said corresponding first or second control signal according to the frequency of said RF signal to be amplified.

14. The system according to claim 1, wherein said first and second power amplifiers comprise MESFETs.

15. The system according to claim 1, wherein said switching device comprises a FET.

16. The system according to claim 1, wherein said FET is responsive to a third control signal from said controller means for switching between an "off" state wherein said FET operates to block current to said first and second amplifiers, to an "on" state wherein said FET conducts current to one of said first or second power amplifiers.

17. A dual band power amplifier circuit comprising:
   first and second power amplifiers each operative to amplify an RF signal of a particular frequency range at an output terminal thereof, wherein said output terminals of said amplifiers are coupled together at a common node, and wherein said amplifiers are operative in a first saturation mode and in a second linear mode;
   a control circuit for providing a first control signal to said first power amplifier and a second control signal to said second power amplifier for controlling the mode of operation of each said amplifier; and
   a switching device having a first terminal coupled to the outputs of said first and second power amplifiers at said common node and to a power source at a second terminal, said switching device responsive to a third control signal from said control circuit for providing a high output impedance to said amplifiers for limiting leakage current when said first and second amplifiers are in said saturation mode, and for enabling current to be drawn from said power source to a particular one of said power amplifiers when said particular power amplifier is in said linear mode.

18. The amplifier circuit according to claim 17, wherein said output terminals of said first and second power amplifiers are coupled at a common node via a first conductor directly connected to the output terminal having via a first conductor having a first terminal connected directly to the output terminal of said first power amplifier and a second terminal connected to said common node, and a second inductor having a first terminal connected directly to the output terminal of said second power amplifier and a second terminal directly connected to said common node.

19. The amplifier circuit according to claim 17, wherein said switching device comprises a single field effect transistor whose gate electrode is connected to said control circuit.

20. The amplifier circuit according to claim 19, wherein said control circuit comprises a single negative voltage generator coupled to a shifting level circuit.

* * * * *